(12) United States Patent
Huang et al.

(10) Patent No.: US 8,476,764 B2
(45) Date of Patent: Jul. 2, 2013

(54) BONDING PAD STRUCTURE FOR SEMICONDUCTOR DEVICES

(75) Inventors: Tse-Yao Huang, Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 148 days.

(21) Appl. No.: 13/235,491

(22) Filed: Sep. 18, 2011

(65) Prior Publication Data

US 2013/0069235 A1    Mar. 21, 2013

(51) Int. Cl.
*H01L 23/48* (2006.01)
*H01L 23/52* (2006.01)
*H01L 29/40* (2006.01)

(52) U.S. Cl.
USPC .......... 257/750; 257/411; 257/E21.006; 257/E21.267; 257/E21.278; 257/E21.293; 257/E21.499

(58) Field of Classification Search
USPC .......... 257/750, 411, 762, 765, 649, 760, 257/774, E21.006, E21.267, E21.278, E21.293, 257/E21.499
See application file for complete search history.

(56) References Cited

U.S. PATENT DOCUMENTS

| | | | | |
|---|---|---|---|---|
| 6,291,281 | B1 * | 9/2001 | Wang et al. | 438/200 |
| 6,599,578 | B2 * | 7/2003 | Peng et al. | 427/402 |
| 7,880,278 | B2 * | 2/2011 | Jeng et al. | 257/669 |
| 7,880,297 | B2 * | 2/2011 | Jao et al. | 257/700 |
| 7,986,027 | B2 * | 7/2011 | Hynes et al. | 257/536 |

* cited by examiner

*Primary Examiner* — David Nhu

(74) *Attorney, Agent, or Firm* — Winston Hsu; Scott Margo

(57) ABSTRACT

A bonding pad structure includes a semiconductor substrate having thereon a plurality of inter-metal dielectric (IMD) layers comprising at least a topmost IMD layer; a bondable metal pad layer disposed on a surface of the topmost IMD layer within a pad forming region; a passivation layer covering a periphery of the bondable metal pad layer and the surface of the topmost IMD layer; and a plurality of via plugs disposed in the topmost IMD layer within an annular region of the pad forming region, wherein the via plugs are not formed in a central region of the pad forming region.

9 Claims, 1 Drawing Sheet

BONDING PAD STRUCTURE FOR SEMICONDUCTOR DEVICES

BACKGROUND OF THE INVENTION

1. Field of the Invention

The present invention relates generally to a semiconductor device, and more particularly, to a bonding pad structure of integrated circuits.

2. Description of the Prior Art

As known in the art, to form a chip package, an integrated circuit chip is attached to a chip carrier such as a leadframe or a package substrate in an assembly process. Wire bonding is then carried out after the integrated circuit chip is attached to the chip carrier. During a wire-bonding process, bond wires are attached one at a time to respective bonding pads or input/output (I/O) pads on the integrated circuit chip, and the other end of the bond wire may be attached to a lead, a bonding pad, or a finger on the chip carrier.

Typically, a wire-bonding process includes the following steps. Firstly, an initial ball is formed at a tip end of a wire passing through a capillary of a wire bonder and the initial ball is pressure-bonded onto the bonding pad of the chip. Thereafter, the capillary is moved upward to a predetermined height away from the pressure-bonded ball, and then the capillary is moved toward a bonding site on the chip carrier, thereby the wire electrically and mechanically connects the bonding pad of the chip and the chip carrier.

Low-k and/or ultra low-k dielectric materials have been widely used for the inter-metal dielectric (IMD) layers to reduce RC delay and parasitic capacitances. However, as the dielectric constant decreases, the strength of the dielectric material decreases. Hence, many low-k dielectric materials are highly susceptible to cracking or lack the strength needed to withstand the stress exerted on the pad during wire bonding. For example, pad lifting phenomenon has been observed during wire-bonding process due to bonding pad delamination and insufficient dielectric strength under the bonding pad.

Thus, a need exists for an improved bonding pad structure that can sustain the stress exerted on it by a wire bonding process, which is capable of solving the prior art pad lifting problem.

SUMMARY OF THE INVENTION

It is one objective of the present invention to provide an improved bonding pad structure in order to solve the above-mentioned prior art problems.

According to one embodiment of this invention, a bonding pad structure includes a semiconductor substrate having thereon a plurality of inter-metal dielectric (IMD) layers comprising at least a topmost IMD layer; a bondable metal pad layer disposed on a surface of the topmost IMD layer within a pad forming region; a passivation layer covering a periphery of the bondable metal pad layer and the surface of the topmost IMD layer; and a plurality of via plugs disposed in the topmost IMD layer within an annular region of the pad forming region, wherein the via plugs are not formed in a central region of the pad forming region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
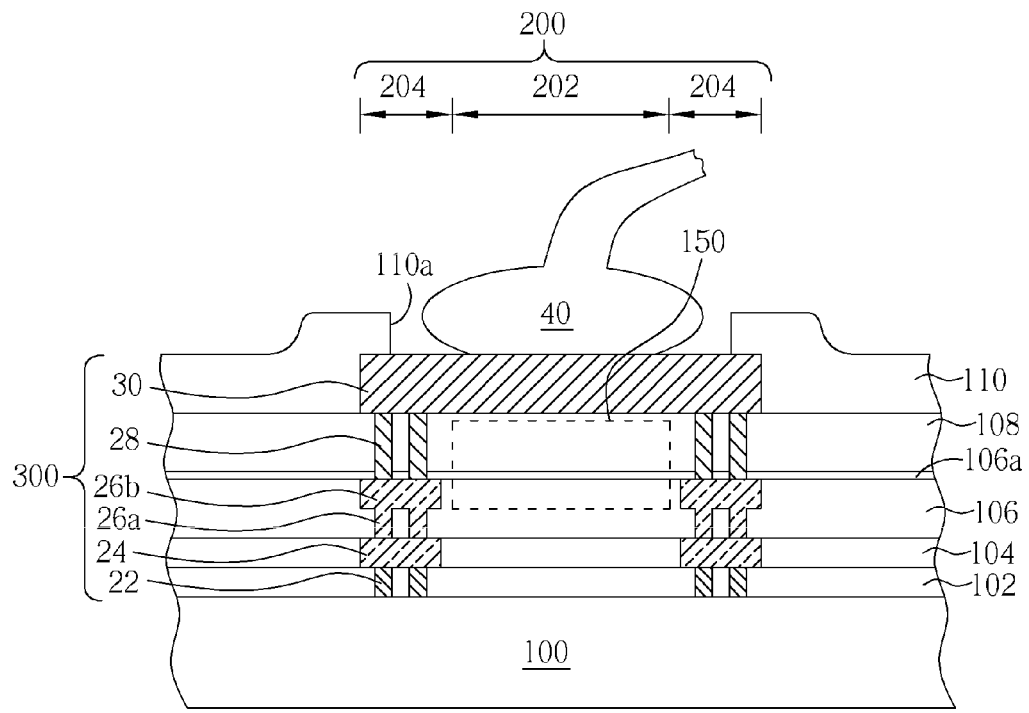
FIG. 1 is a schematic, cross-sectional diagram showing a bonding pad structure fabricated within a pad forming region according to one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Figure 2:
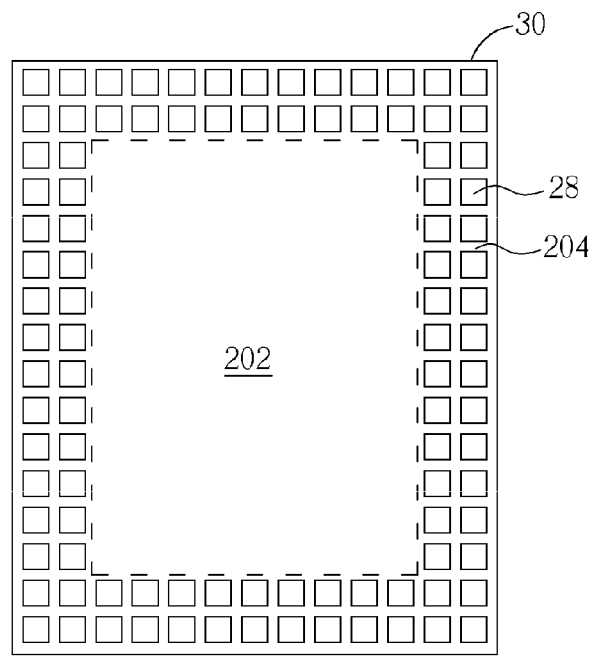
FIG. 2 is a perspective top view of the bonding pad structure according to the embodiment of this invention.

Please refer to FIG. 1 and FIG. 2. FIG. 1 is a schematic, cross-sectional diagram showing a bonding pad structure 300 fabricated within a pad forming region 200 according to one embodiment of this invention. FIG. 2 is a perspective top view of the bonding pad structure 300 according to the embodiment of this invention. As shown in FIG. 1 and FIG. 2, a semiconductor substrate 100 such as a silicon substrate is provided. A plurality of inter-metal dielectric (IMD) layers 102~108 are laminated on a main surface of the semiconductor substrate 100. The IMD layers 102~108 may comprise silicon oxide, silicon nitride, silicon oxy-nitride, silicon carbide, BSG, BPSG, low-k or ultra low-k dielectrics known in the art.

On a top surface of the IMD layer 108, as shown in FIG. 1, a bondable metal pad layer 30 such as an aluminum pad, which may be a part of a re-distributed layer (RDL) in some cases, is provided within the pad forming region 200. After the formation of the bondable metal pad layer 30, a passivation layer 110 such as a silicon nitride, polyimide or any suitable passivation material is employed to cover the bondable metal pad layer 30 and the top surface of the IMD layer 108. An opening 110a is then formed in the passivation layer 110 to expose a portion of the bondable metal pad layer 30. Thereafter, a bond wire 40 is attached to the exposed surface of the bondable metal pad layer 30 through the opening 110a.

As previously mentioned, during the wire-bonding process, the stress exerted on the bondable metal pad layer 30 may cause the pad lifting problem. The applicant has found that the aluminum segregation at the copper-SiC cap interface may play an important role in the pad lifting issue. To avoid this, according to one embodiment of this invention, no interconnection structure is formed in a three-dimensional space 150 (indicated with dashed line) directly under the bondable metal pad layer 30 within a central region 202 of the pad forming region 200.

As shown in FIG. 1 and FIG. 2, the bonding pad structure 300 comprises the bondable metal pad layer 30 on the IMD layer 108, a plurality of via plugs 28 fabricated in the IMD layer 108 to couple the bondable metal pad layer 30 to an underlying second-level damascened copper structures 26*a* and 26*b* fabricated in the IMD layer 106. A silicon carbide cap layer 106*a* may be provided in the IMD layer 106. According to the embodiment of this invention, the plurality of via plugs 28 are fabricated within an annular region 204 that surrounds the central region 202 of the pad forming region 200. According to the embodiment of this invention, the damascened copper structure 26*b* may be an annular shaped or ring shaped copper layer, and the damascened copper structure 26*a* may comprise a plurality of copper via plugs. A Similar annular shaped or ring shaped damascened copper structure 24 may be formed in the IMD layer 104. A contact plug layer 22 may be provided in the IMD layer 102. It is to be understood that, in some embodiments, the contact plug layer 22 may be omitted. It is to be understood that, in some embodiments, the damascened copper structure 24 may be in the IMD layer 104 may be omitted.

It is advantageous to use the present invention because no interconnection structure, particularly damascened copper structure, is formed in the three-dimensional space 150 directly under the bondable metal pad layer 30 within a central region 202 of the pad forming region 200, whereby the pad lifting problem can be avoided. The applicant has found that by excluding the via plugs 28 and the damascened copper structure from being formed within the three-dimensional space 150 directly under the bondable metal pad layer 30 within a central region 202 of the pad forming region 200, the aluminum segregation at the copper-SiC cap interface can be avoided and the integrity of the IMD layers and the bonding strength therebetween, particularly between the silicon carbide cap layer 106*a* and the rest part of the IMD layer 106, can be greatly improved.

Those skilled in the art will readily observe that numerous modifications and alterations of the device and method may be made while retaining the teachings of the invention.

What is claimed is:

1. A bonding pad structure, comprising:
    a semiconductor substrate having thereon a plurality of inter-metal dielectric (IMD) layers comprising at least a topmost IMD layer;
    a bondable metal pad layer disposed on a surface of the topmost IMD layer within a pad forming region;
    a passivation layer covering a periphery of the bondable metal pad layer and the surface of the topmost IMD layer; and
    a plurality of via plugs disposed in the topmost IMD layer within an annular region of the pad forming region, wherein the plurality of via plugs are not formed in a central region of the pad forming region.

2. The bonding pad structure according to claim 1 wherein no interconnection structure is formed in a three-dimensional space directly under the bondable metal pad layer within the central region of the pad forming region.

3. The bonding pad structure according to claim 2 wherein the interconnection structure is damascened copper structure.

4. The bonding pad structure according to claim 3 wherein the topmost IMD layer is directly laminated on a silicon carbide cap layer.

5. The bonding pad structure according to claim 4 wherein by excluding the plurality of via plugs and the damascened copper structure from being formed within the three-dimensional space directly under the bondable metal pad layer within the central region of the pad forming region, aluminum segregation at copper-silicon carbide cap interface is avoided.

6. The bonding pad structure according to claim 1 wherein the IMD layers comprise silicon oxide, silicon nitride, silicon oxy-nitride, silicon carbide, BSG, BPSG, low-k or ultra low-k dielectrics.

7. The bonding pad structure according to claim 1 wherein the bondable metal pad layer comprises aluminum.

8. The bonding pad structure according to claim 1 wherein the bondable metal pad layer is a part of a re-distributed layer (RDL).

9. The bonding pad structure according to claim 1 wherein further comprising an annular shaped or ring shaped damascened copper structure.

* * * * *